(12) United States Patent
Kal et al.

(10) Patent No.: US 7,709,849 B1
(45) Date of Patent: May 4, 2010

(54) LIGHT EMITTING DIODE HAVING PLURALITY OF LIGHT EMITTING CELLS AND METHOD OF FABRICATING THE SAME

(75) Inventors: Dae Sung Kal, Ansan-si (KR); Dae Won Kim, Ansan-si (KR); Won Cheol Seo, Ansan-si (KR); Kyung Hee Ye, Ansan-si (KR); Joo Woong Lee, Ansan-si (KR)

(73) Assignee: Seoul Semiconductor Co., Ltd., Seoul (KR)

( * ) Notice: Subject to any disclaimer, the term of this patent is extended or adjusted under 35 U.S.C. 154(b) by 0 days.

(21) Appl. No.: 12/620,887

(22) Filed: Nov. 18, 2009

(30) Foreign Application Priority Data

Dec. 17, 2008 (KR) ...................... 10-2008-0128522

(51) Int. Cl.
*H01L 29/18* (2006.01)

(52) U.S. Cl. .............................. 257/96; 257/97; 257/99; 257/E33.062

(58) Field of Classification Search .................... 257/88, 257/96, 97, 99, E33.062
See application file for complete search history.

(56) References Cited

U.S. PATENT DOCUMENTS

| | | | |
|---|---|---|---|
| 6,472,718 B2 | 10/2002 | Lell | |
| 6,547,249 B2 | 4/2003 | Collins et al. | |
| 6,635,902 B1 | 10/2003 | Lin | |
| 6,957,899 B2 | 10/2005 | Jiang et al. | |
| 7,034,340 B2 | 4/2006 | Yukimoto | |
| 7,210,819 B2 | 5/2007 | Jiang et al. | |
| 7,213,942 B2 | 5/2007 | Jiang et al. | |
| 7,221,044 B2 | 5/2007 | Fan et al. | |
| 7,271,421 B2 | 9/2007 | Yukimoto et al. | |
| 7,474,681 B2 | 1/2009 | Lin et al. | |
| 7,511,311 B2 | 3/2009 | Kususe et al. | |
| 7,525,248 B1 | 4/2009 | Fan | |
| 2005/0224973 A1 | 10/2005 | Bernier et al. | |
| 2005/0225973 A1 | 10/2005 | Eliashevich et al. | |
| 2006/0043433 A1 | 3/2006 | Matsushita | |
| 2006/0044864 A1 | 3/2006 | Lin et al. | |
| 2008/0083929 A1* | 4/2008 | Fan et al. ...................... | 257/79 |
| 2008/0230765 A1 | 9/2008 | Yoon et al. | |

FOREIGN PATENT DOCUMENTS

| | | |
|---|---|---|
| WO | 2004-013916 | 2/2004 |
| WO | 2004-023568 | 3/2004 |
| WO | 2007-081092 | 7/2007 |
| WO | 2008-111693 | 9/2008 |

* cited by examiner

*Primary Examiner*—Wael Fahmy
*Assistant Examiner*—Paul E Patton
(74) *Attorney, Agent, or Firm*—H.C. Park & Associates, PLC

(57) ABSTRACT

The present invention discloses a light emitting diode. The light emitting diode includes a plurality of light emitting cells arranged on a substrate, each light emitting cell including a first semiconductor layer and a second semiconductor layer arranged on the first semiconductor layer; a first dielectric layer arranged on each light emitting cell and including a first opening to expose the first semiconductor layer and a second opening to expose the second semiconductor layer; a wire arranged on the first dielectric layer to couple two of the light emitting cells; and a second dielectric layer arranged on the first dielectric layer and the wire. The first dielectric layer and the second dielectric layer comprise the same material and the first dielectric layer is thicker than the second dielectric layer.

14 Claims, 4 Drawing Sheets

LIGHT EMITTING DIODE HAVING PLURALITY OF LIGHT EMITTING CELLS AND METHOD OF FABRICATING THE SAME

CROSS REFERENCE TO RELATED APPLICATIONS

This application claims priority from and the benefit of Korean Patent Application No. 10-2008-0128522, filed on Dec. 17, 2008, which is hereby incorporated by reference for all purposes as if fully set forth herein.

BACKGROUND OF THE INVENTION

1. Field of the Invention

The present invention relates to a light emitting diode and a method of fabricating the same. More particularly, the present disclosure relates to a light emitting diode that includes a plurality of light emitting cells, wires connecting the light emitting cells to each other, and dielectric layers for protecting the light emitting cells and the wires, and to a method of is fabricating the same.

2. Discussion of the Background

Since gallium nitride (GaN)-based blue light emitting diodes (LEDs) were developed, attempts have been made to improve luminescent efficiency of these LEDs, and a variety of structural improvements for various applications have been proposed. GaN-based blue or ultraviolet (UV) light emitting diodes are widely used for applications, such as natural color LED devices, LED traffic signal boards, white LEDs, etc., and may replace white fluorescent lamps in the field of general lighting.

A light emitting diode may emit light by application of a forward current and may require a direct current power supply. In consideration of characteristics of the light emitting diode operating by the forward current, light emitting diodes have been developed which include a plurality of light emitting cells connected in reverse parallel or operated using a bridge rectifier, and which operate using an alternating current power source. Further, light emitting diodes have been developed which include a plurality of light emitting cells formed on a single substrate and are connected in series and in parallel to emit light with high-output and high-efficiency using a high-voltage direct current power source. In these light emitting diodes, the plurality of light emitting cells may be formed on the single substrate and connected via wires to emit light with high-output and high-efficiency using the alternating or direct current power source.

One example of the light emitting diodes including the plurality of light emitting cells connected to the high-voltage alternating or direct current power source is disclosed in Sakai, et. al., WO 2004/023568 A1, entitled "light-emitting device having light-emitting elements," which is hereby incorporated by reference for all purposes as if fully set forth herein.

The light emitting cells may be connected to each other by air bridge wires, is thereby providing a light emitting diode which can be operated by the alternating or direct current power source.

However, an interconnection between the light emitting cells via the air-bridge wires may cause the wires to deteriorate, that is, problems such as disconnection of the wires or increase in wiring resistance due to moisture or impact from the outside. To prevent such problems, a wire connection technology based on a step-cover process may be adopted. The step-cover process includes forming wires on a dielectric layer covering the light emitting cells. Since the wires are located on the dielectric layer, they may be more stable than the air-bridge wires.

However, the wires formed by the step-cover process may be exposed to the outside and may also be disconnected by moisture or external impact. The light emitting diode having the plurality of light emitting cells includes a number of wires and cannot be operated if any one of the wires is disconnected. Furthermore, since a number of wires are used in the light emitting diode, moisture may intrude into the light emitting cells along the wires, thereby deteriorating luminescent efficiency of the light emitting cells.

When the light emitting diode is used for practical applications such as general lighting and the like, there is a need to realize a variety of colors such as white light through conversion of UV or blue light into light having longer wavelengths via fluorescent materials. Conventionally, such fluorescent materials may be contained in an epoxy which covers a light emitting diode that emits short wavelength light in a package. For such a white light emitting diode, a color-conversion material layer containing the fluorescent materials may be formed during a packaging process, which is independent of a process of fabricating the light emitting diode chip, so that the packaging process may become complicated, thereby causing a high failure rate in the packaging process. Failures that occur during the packaging process may be is more expensive than those that occur during the process of fabricating the light emitting diode chip.

SUMMARY OF THE INVENTION

The present invention provides a light emitting diode that may prevent disconnection of wires, increase in wire resistance, or performance deterioration of light emitting cells caused by moisture intrusion or external impact, and a method of fabricating the same.

The present invention also provides a light emitting diode that includes a dielectric layer to protect wires and light emitting cells, and has a reinforced bonding force between the dielectric layer and an underlayer having the dielectric layer arranged thereon, and a method of fabricating the same.

The present invention also provides a light emitting diode that includes a fluorescent material that converts a wavelength of light emitted from light emitting cells at a chip level, and a method of fabricating the same.

Additional features of the invention will be set forth in the description which follows, and in part will be apparent from the description, or may be learned by practice of the invention.

The present invention discloses a light emitting diode device that includes: a plurality of light emitting cells arranged on a substrate, each light emitting cell including a first semiconductor layer and a second semiconductor layer arranged on the first semiconductor layer; a first dielectric layer arranged on each light emitting cell and including a first opening to expose the first semiconductor layer and a second opening to expose the second semiconductor layer; a wire arranged on the first dielectric layer to couple two of the light emitting cells; and a second is dielectric layer arranged on the first dielectric layer and the wire. The first dielectric layer and the second dielectric layer include the same material and the first dielectric layer is thicker than the second dielectric layer.

The present invention discloses a method of fabricating a light emitting diode device that includes: preparing a substrate; forming a plurality of light emitting cells on the substrate, each light emitting cell including a first semiconductor layer and a second semiconductor layer; forming a first dielectric layer on each light emitting cell; patterning the first dielectric layer to form a first opening on the first semiconductor layer and a second opening on the second semiconductor layer; forming a wire on the first dielectric layer to couple at least two of the light emitting cells; and forming a second dielectric layer on the first dielectric layer and the wire. The first dielectric layer and the second dielectric layer include the same material and the first dielectric layer is thicker than the second dielectric layer.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention, and together with the description serve to explain the principles of the invention.

DETAILED DESCRIPTION OF THE ILLUSTRATED EMBODIMENTS

Figure 1:
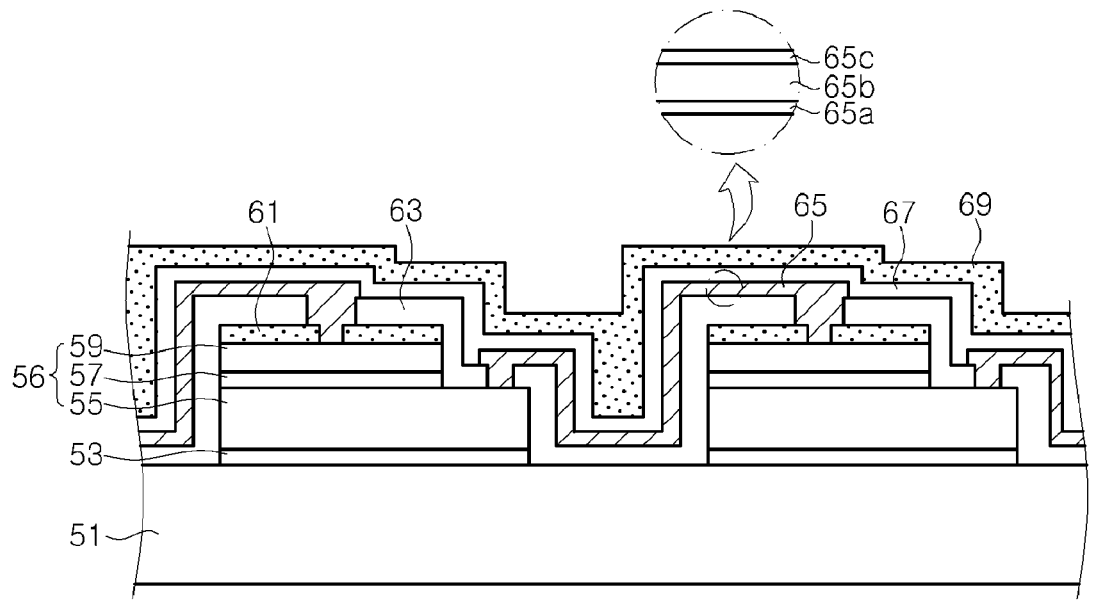
FIG. 1 is a cross-sectional view of a light emitting diode in accordance with a first exemplary embodiment of the present invention.

The invention is described more fully hereinafter with reference to the accompanying drawings, in which exemplary embodiments of the invention are shown. This invention may, however, be embodied in many different forms and should not be construed as limited to the exemplary embodiments set forth herein. Rather, these exemplary embodiments are provided so that this disclosure is thorough, and will fully convey the scope of the invention to those skilled in the art. In the drawings, the size and relative sizes of layers and regions may be exaggerated for clarity. Like reference numerals in the drawings denote like elements.

It will be understood that when an element or layer is referred to as being "on" or "connected to" another element or layer, it can be directly on or directly connected to the other element or layer, or intervening elements or layers may be present. In contrast, when an element is referred to as being "directly on" or "directly connected to" another element or layer, there are no intervening elements or layers present.

FIG. 1 is a cross-sectional view of a light emitting diode in accordance with a first exemplary embodiment of the present invention.

Referring to FIG. 1, a light emitting diode according to the first exemplary embodiment includes a substrate 51, a plurality of light emitting cells 56, a first dielectric layer 63, wires 65 and a second dielectric layer 67, and may further include a buffer layer 53, a transparent electrode layer 61 and a phosphor layer 69. The substrate 51 may be an insulation substrate, for example, a sapphire substrate.

The plurality of light emitting cells 56 are separated from each other on the single substrate 51. Each of the light emitting cells 56 includes a lower semiconductor layer 55, an upper semiconductor layer 59 located above one region of the lower semiconductor layer 55, and an active layer 57 interposed between the upper and lower semiconductor layers. Here, the upper and lower semiconductor layers are n-type and p-type semiconductor layers or vice versa, respectively.

The lower semiconductor layer 55, the active layer 57, and the upper semiconductor layer 59 may be formed of GaN-based materials, that is, (Al, In, Ga)N. The composition of the active layer 57 is determined to allow the emission of light having a desired wavelength, for example, UV or blue light. The lower and upper semiconductor layers 55 and 59 are formed of materials having higher band-gap energies than the active layer 57.

The lower semiconductor layer 55 and/or the upper semiconductor layer 59 may be formed in a single layer as shown in the drawing, or may be formed in a multilayer structure. Further, the active layer 57 may have a single or multi-quantum well structure.

A buffer layer 53 may be interposed between the light emitting cells 56 and the substrate 51. The buffer layer 53 may be adopted to relieve lattice mismatch between the is substrate 51 and the lower semiconductor layer 55.

The first dielectric layer 63 covers the overall surfaces of the light emitting cells 56. The first dielectric layer 63 has openings formed on other regions of the lower semiconductor layers 55, that is, regions adjacent to the regions of the lower semiconductor layers 55 on which the upper semiconductor layers 59 is arranged, and openings formed on the upper semiconductor layers 59. The openings are separated from one another, so that lateral walls of the light emitting cells 56 are covered by the first dielectric layer 63. The first dielectric layer 63 also covers the substrate 51 on regions between the light emitting cells 56. The first dielectric layer 63 may be a silicon oxide ($SiO_2$) layer or a silicon nitride layer and may be formed at 200~300° C. by plasma enhanced CVD. Here, the first dielectric layer 63 may have a thickness of 4500 Å~1 μm. If the first dielectric layer has a thickness less than 4500 Å, the first dielectric layer is comparatively decreased in thickness at lower sides of the light emitting cells due to layer covering characteristics, and electrical disconnection may occur between the light emitting cells and the wires formed on the first dielectric layer. On the other hand, although the electrical disconnection between the wires and the light emitting cells may be more easily prevented with increasing thickness of the first dielectric layer, an excessive thickness of the first dielectric layer may deteriorate optical transmittance, thereby reducing luminescent efficiency. Accordingly, it is desirable that the first dielectric layer have a thickness not exceeding 1 μm.

The wires 65 are formed on the first dielectric layer 63. The wires 65 are electrically connected to the lower and upper semiconductor layers 55 and 59 via the openings. Further, the wires 65 may electrically connect the lower semiconductor layers 55 and the upper semiconductor layers 59 of adjacent light emitting cells 56 to form series arrays of the light emitting cells 56. A plurality of serial arrays may be formed and connected in inverse parallel to is be operated by an alternating current power source. Further, a bridge rectifier (not shown) connected to the serial arrays of the light emitting cells may be formed so that the light emitting cells may be driven by the bridge rectifier via the alternating current power source. The bridge rectifier may be formed by connecting the light emitting cells having the same structure as that of the light emitting cell 56 to each other via the wires 65.

Alternatively, the wires 65 may connect the lower semiconductor layers 55 or the upper semiconductor layers 59 of the adjacent light emitting cells 56 to each other. As a result, the plurality of light emitting cells 56 may be connected in series or in parallel.

The wires 65 may be formed of an electrically conductive material, for example, a metal or an impurity-doped silicon material such as polycrystalline silicon. Particularly, the wires 65 may be formed in a multilayer structure and may include a Cr or Ti lower layer 65a and a Cr or Ti upper layer 65c. Further, an Au, Au/Ni, or Au/Al middle layer 65b may be interposed between the lower layer 65a and the upper layer 65c.

The transparent electrode layer 61 may be interposed between the upper semiconductor layers 59 and the first dielectric layer 63. The transparent electrode layers 61 are exposed through the openings formed on the upper semiconductor layers 59. The transparent electrode layers 61 allow light generated from the active layer 57 to penetrate and to supply a dispersed current to the upper semiconductor layers 59. The wires 65 may contact the transparent electrode layers 61 exposed through the openings, the wires 65 to be electrically connected to the upper semiconductor layers 59. Further, the transparent electrode layers 61 may have openings through which the upper semiconductor layers 59 are exposed, and the wires 65 fill in the openings in the transparent electrode layers 61.

The second dielectric layer 67 covers the wires 65 and the first dielectric layer 63. The second dielectric layer 67 prevents the wires 65 from being contaminated by moisture and the like, and also prevents the wires 65 and the light emitting cells 56 from being damaged by external impact.

The second dielectric layer 67 may be formed of silicon oxide ($SiO_2$) or silicon nitride, which is the same material as that of the first dielectric layer 63. Similar to the first dielectric layer 63, the second dielectric layer 67 may be formed at 200~300° C. by plasma enhanced CVD. When the first dielectric layer 63 is formed by plasma enhanced CVD, the second dielectric layer 67 may be formed at a temperature in the range of −20~+20% of the deposition temperature of the first dielectric layer 63. The second dielectric layer 67 may be formed at the same deposition temperature as that of the first dielectric layer 63.

Figure 2:
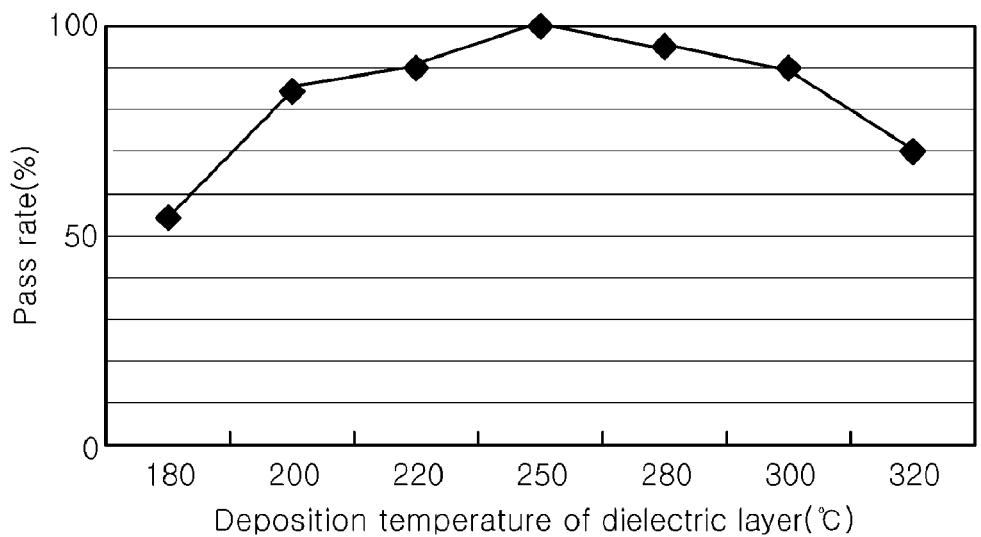
FIG. 2 is a graph depicting a reliability testing pass rate depending on deposition temperatures of first and second dielectric layers.

FIG. 2 is a graph depicting a reliability testing pass rate of samples depending on deposition temperature of first and second dielectric layers 63 and 67 in the first exemplary embodiment. For the reliability testing, the samples were prepared by depositing a silicon oxide layer as the first dielectric layer 63 at 250° C. and depositing another silicon oxide layer as the second dielectric layer 67 while changing the deposition temperature. The reliability testing was performed for 1000 hours. 20 samples were prepared for testing at each deposition temperature of the second dielectric layer 67 and each of the samples was tested under humid conditions. Referring to FIG. 2, when the second dielectric layer 67 was deposited at a temperature in the range of −20~+20% of the deposition temperature (250° C.) of the first dielectric layer 63, the sample exhibited superior reliability. On the other hand, when the deposition temperature of the second dielectric layer 67 exceeded this range, the reliability was rapidly decreased. Further, when the first and second dielectric layers 63 and 67 were deposited at the same temperature, the success rate was 100%, which is the highest reliability.

The second dielectric layer 67 may have a thickness of at least 500 Å, and is thinner than the first dielectric layer 63.

Since the second dielectric layer 67 is thinner than the first dielectric layer 63, the second dielectric layer can be prevented from being delaminated from the first dielectric layer. When the second dielectric layer 67 is thinner than 500 Å, it is difficult to protect the wires 65 and the light emitting cells 56 from external impact or moisture intrusion.

The phosphor layer 69 may contain a phosphor dispersed in a resin or may be deposited by electrophoresis. The phosphor layer 69 covers the second dielectric layer 67 and converts the wavelength of light emitted from the light emitting cells 56.

FIG. 3, FIG. 4, FIG. 5, FIG. 6, FIG. 7, FIG. 8, and FIG. 9 are cross-sectional views of a method of fabricating a light emitting diode according to the first exemplary embodiment of the present invention.

Figure 3:
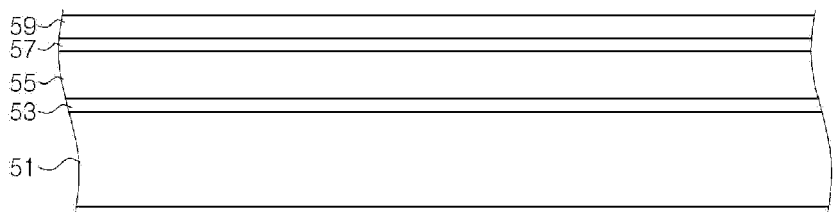
FIG. 3, FIG. 4, FIG. 5, FIG. 6, FIG. 7, FIG. 8, and FIG. 9 are cross-sectional views of a method of fabricating a light emitting diode according to the first exemplary embodiment of the present disclosure.

Referring to FIG. 3, a lower semiconductor layer 55, an active layer 57, and an upper semiconductor layer 59 are formed on a substrate 51. Further, a buffer layer 53 may be formed on the substrate 51 before the formation of the lower semiconductor layer 55.

A material for the substrate 51 may include, but is not limited to, sapphire ($Al_2O_3$), silicon carbide (SiC), zinc oxide (ZnO), silicon (Si), gallium arsenide (GaAs), gallium phosphide (GaP), lithium-alumina ($LiAl_2O_3$), boron nitride (BN), aluminum nitride (AlN), or GaN, and may be selected from other materials depending on materials of the semiconductor layer formed thereon.

The buffer layer 53 is formed to relieve lattice mismatch between the substrate 51 and the semiconductor layer 55, and may be formed of, for example, GaN or AlN. If the substrate 51 is an electrically conductive substrate, the buffer layer 53 may be formed of an is insulating or semi-insulating layer and may be formed of AlN or semi-insulating GaN.

The lower semiconductor layer 55, the active layer 57, and the upper semiconductor layer 59 may be formed of GaN-based materials, that is, (Al, In, Ga)N. The lower and upper semiconductor layers 55 and 59 and the active layer 57 may be intermittently or continuously grown by metal-organic chemical vapor deposition (MOCVD), molecular beam epitaxy (MBE), hydride vapor phase epitaxy (HVPE), or the like.

Here, the upper and lower semiconductor layers 59 and 55 are n-type and p-type semiconductor layers or vice versa, respectively. In a GaN-based compound semiconductor layer, the n-type semiconductor layer may be formed by doping an impurity, for example, Si, and the p-type semiconductor layer may be formed by doping an impurity, for example, Mg.

Figure 4:
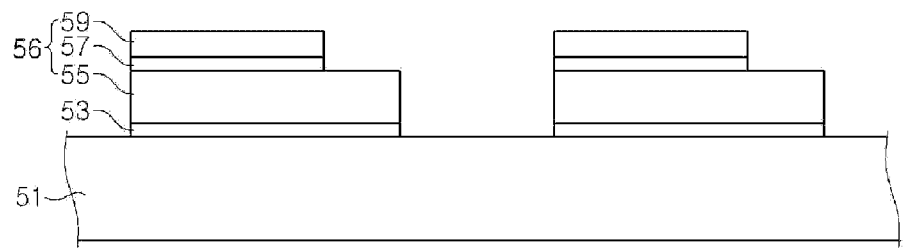

Referring to FIG. 4, light emitting cells 56 are formed to be separated from each other by patterning the upper semiconductor layer 59, the active layer 57, and the lower semiconductor layer 55. In this process, the upper semiconductor layer 59 is located on one region of the lower semiconductor layer 55, and the other region of the lower semiconductor layer 55 is exposed. The buffer layer 53 between the light emitting cells 56 may be removed to expose the substrate 51.

Figure 5:
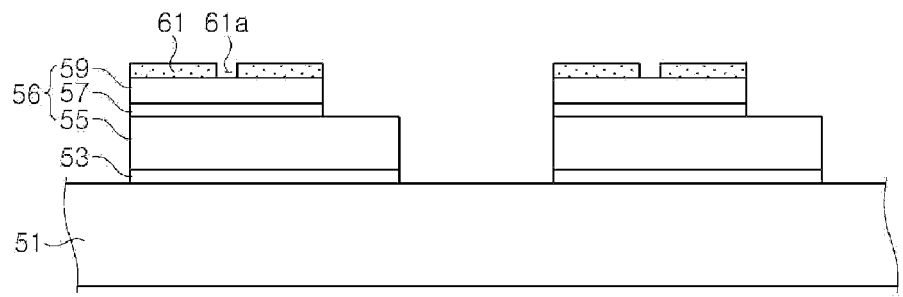

Referring to FIG. 5, a transparent electrode layer 61 may be formed on the upper semiconductor layer 59 of the light emitting cell 56. The transparent electrode layer 61 may be formed of a metal oxide, such as indium tin oxide (ITO), or a transparent metal. For the transparent metal, the transparent electrode layer 61 may comprise at least one selected from the group consisting of Au, Ni, Pt, Al, Cr, Ti, and alloys thereof.

The transparent electrode layer 61 may have an opening 61a through which the upper semiconductor layer 59 is exposed. Although the transparent electrode layer 61 may be is formed by deposition on the light emitting cells 56, the transparent electrode layer 61 may be formed on the upper semiconductor layer 59 before the formation of the light emitting cells 56 and then patterned before patterning the upper semiconductor layer 59.

The transparent electrode layer 61 may be heat-treated at 500~800° C. for ohmic contact with the upper semiconductor layer 59.

Figure 6:
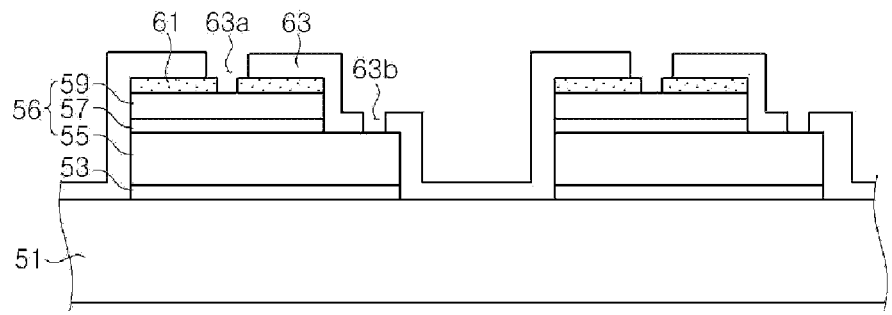

Referring to FIG. 6, a first dielectric layer 63 is formed over the substrate 51 having the light emitting cells 56. The first dielectric layer 63 covers lateral walls and upper surfaces of the light emitting cells 56, and upper surfaces of regions of the substrate 51 in regions between the light emitting cells 56. The first dielectric layer 63 may be, for example, a silicon oxide layer or a silicon nitride layer formed by plasma enhanced CVD. In this case, the first dielectric layer 63 may be deposited at 200~300° C. and have a thickness of 4500 Å~1 μm.

Then, the first dielectric layer 63 is patterned to form openings 63a on the upper semiconductor layers 59 and openings 63b on the other regions of the lower semiconductor layers 55. When the transparent electrode layers 61 are formed, the transparent electrode layers 61 are exposed through the openings 63a. Further, when the transparent electrode layers 61 have openings 61a, the openings 63a of the first dielectric layer 63 expose the openings 61a of the transparent electrode layers 61.

Figure 7:
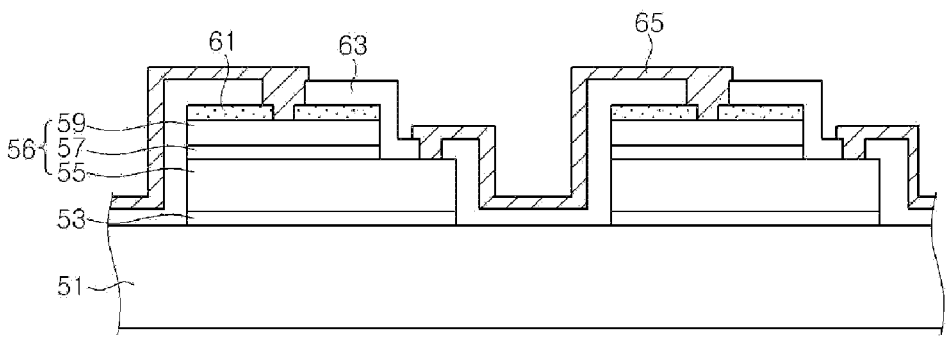

Referring to FIG. 7, wires 65 are formed on the first dielectric layer 63 which has the openings 63a and 63b. The wires 65 are electrically connected to the lower semiconductor layers 55 and the upper semiconductor layers 59 through the openings 63b and 63a, respectively, and electrically connect the adjacent light emitting cells 56 to each other.

The wires 65 may be formed by plating, general electron beam deposition, CVD, or physical vapor deposition (PVD).

The wires 65 may be formed of an electrically conductive material, for example, a metal or an impurity-doped silicon material such as polycrystal silicon. Particularly, the wires 65 may be formed in a multilayer structure and may include, for example, a Cr or Ti lower layer 65a and a Cr or Ti upper layer 65c (see FIG. 1). Further, an Au, Au/Ni, or Au/Al middle layer 65b (see FIG. 1) may be interposed between the lower layer 65a and the upper layer 65c. The wires 65 may be heat-treated at 300~500° C. to improve the bonding force between the wires 65 and the first dielectric layer 63.

Figure 8:
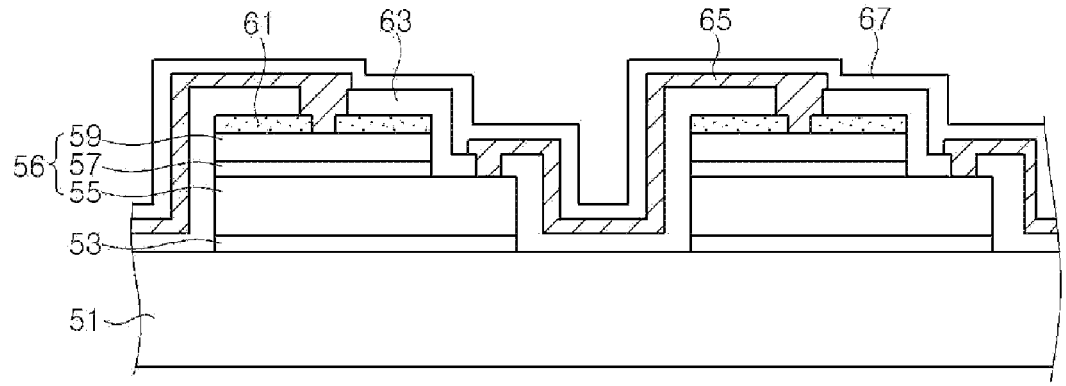

Referring to FIG. 8, a second dielectric layer 67 is formed over the substrate 51 having the wires 65 formed thereon. The second dielectric layer 67 covers the wires 65 and the first dielectric layer 63. The second dielectric layer 67 may be formed of silicon oxide ($SiO_2$) or silicon nitride, which is the same material as that of the first dielectric layer 63, and formed at 200~300° C. by plasma enhanced CVD. Particularly, the second dielectric layer 67 may be formed at a temperature in the range of −20~+20% of the deposition temperature of the first dielectric layer 63.

Figure 9:
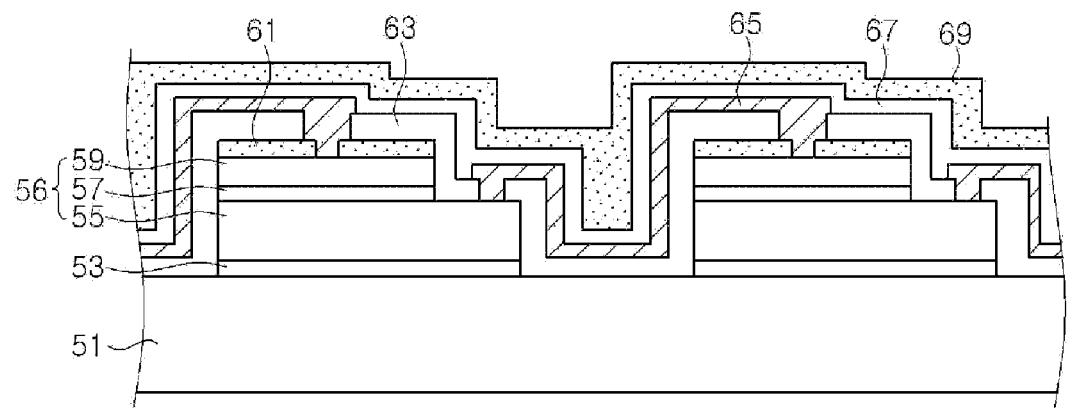

Referring to FIG. 9, a phosphor layer 69 may be formed on the second dielectric layer 67. The phosphor layer 69 may be coated on the second dielectric layer 67 by applying a mixture of a resin and a phosphor, which is prepared by dispersing the phosphor in the resin, or by electrophoresis. As a result, a light emitting diode having a fluorescent material is prepared at a chip level.

Figure 10:
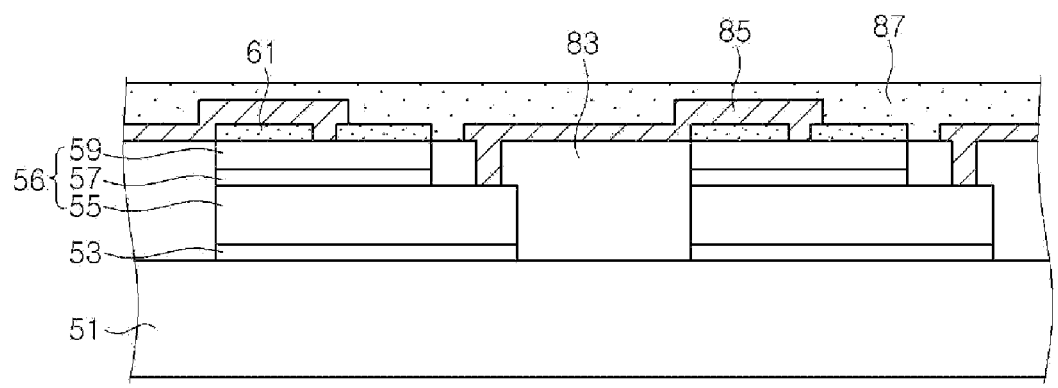
FIG. 10 is a cross-sectional view of a light emitting diode in accordance with a second exemplary embodiment of the present disclosure.

FIG. 10 is a cross-sectional view of a light emitting diode in accordance with a second exemplary embodiment of the present invention. In this light emitting diode, a polymer is employed for first and second dielectric layers.

Referring to FIG. 10, the light emitting diode includes a substrate 51, a plurality of is light emitting cells 56, a first dielectric layer 83, wires 85, and a second dielectric layer 87, and may further include a buffer layer 53 and a transparent electrode layer 61. The substrate 51, the light emitting cells 56, and the transparent electrode layer 61 are the same as those of the first exemplary embodiment, and detailed descriptions thereof will be omitted herein.

The first dielectric layer 83 is formed of SOG, BCG, or other transparent polymers to fill in spaces between the light emitting cells 56. The first dielectric layer 83 covers other regions of the lower semiconductor layers 55. In this case, the first dielectric layer 83 has openings through which the lower semiconductor layers 55 are exposed. Further, the first dielectric layer 83 exposes the upper semiconductor layers 59 or the transparent electrode layers 61. Lateral walls of the light emitting cells 56 are covered by the first insulating layer 83.

The wires 85 are formed on the first dielectric layer 83 and electrically connected to the lower and upper semiconductor layers 55 and 59. The wires 85 are electrically connected to the lower and upper semiconductor layers 55 and 59 via the openings. Further, the wires 85 may electrically connect the lower semiconductor layers 55 and the upper semiconductor layers 59 of adjacent light emitting cells 56 to one another to constitute serial arrays of the light emitting cells 56. A plurality of serial arrays may be formed and connected in inverse parallel to each other to be operated by an alternating current power source. Further, a bridge rectifier (not shown) connected to the serial arrays of the light emitting cells 56 may be formed so that the light emitting cells 56 can be driven by the bridge rectifier via the alternating current power source. The bridge rectifier may be formed by connecting the light emitting cells having the same structure as that of the light emitting cell 56 to each other via the wires 85.

The wires 85 may connect the lower semiconductor layers 55 or the upper semiconductor layers 59 of the adjacent light emitting cells 56 to each other. As a result, the is plurality of light emitting cells 56 may be connected to each other in series or in parallel.

The wires 85 may be formed of an electrically conductive material, for example, a metal or an impurity-doped silicon material such as polycrystalline silicon. Particularly, the wires 85 may be formed in a multilayer structure.

The second dielectric layer 87 covers the wires 85 and the first dielectric layer 83. The second dielectric layer 87 is formed of the same polymer as that of the first dielectric layer 83. Accordingly, a bonding force between the first dielectric layer 83 and the second dielectric layer 87 is increased. Further, the second dielectric layer 87 may be thinner than the first dielectric layer 83, which fills in the spaces between the light emitting cells 56.

The second dielectric layer 87 may contain a phosphor. Accordingly, it is possible to provide a light emitting diode capable of converting a wavelength of light emitted by a light emitting cell 56 at a chip level.

In the second exemplary embodiment, since the first dielectric layer is formed of the polymer, the wires 85 and the second dielectric layer 87 can be formed on the relatively flat first dielectric layer 83, thereby further improving reliability of the wires.

Figure 11:
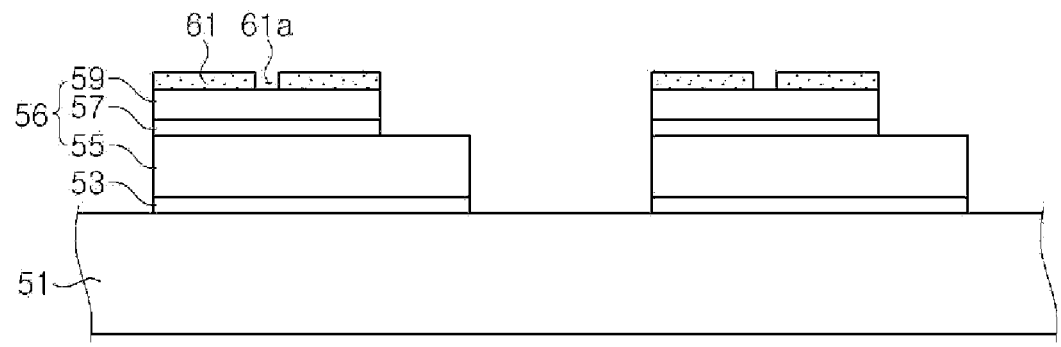
FIG. 11, FIG. 12, and FIG. 13 are cross-sectional views of a method of fabricating a light emitting diode according to the second exemplary embodiment of the present disclosure.
Figure 12:
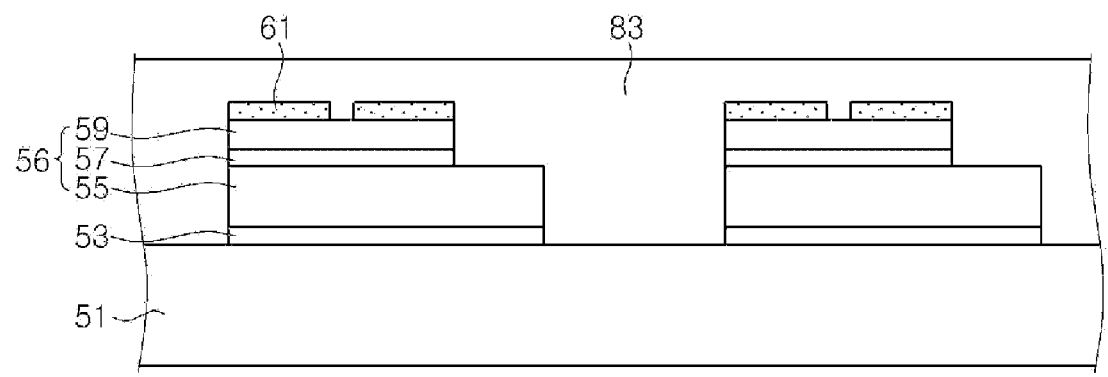
Figure 13:
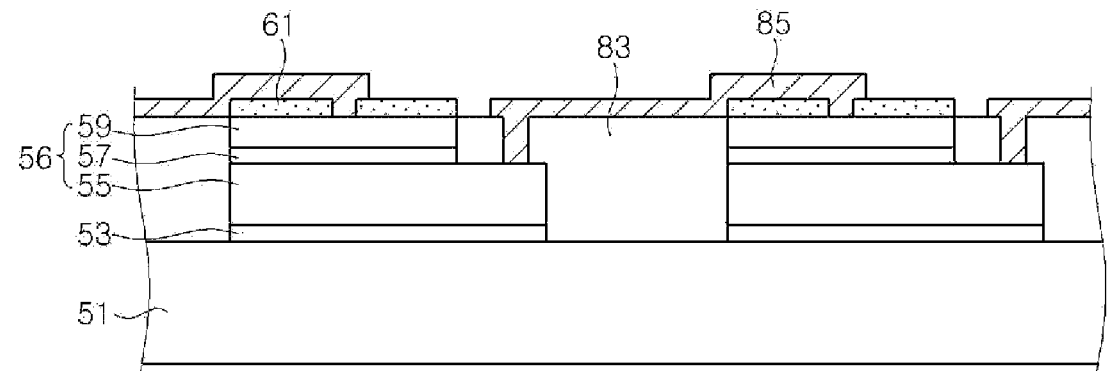

FIG. 11, FIG. 12, and FIG. 13 are cross-sectional views of a method of fabricating a light emitting diode according to the second exemplary embodiment of the present invention.

Referring to FIG. 11, a plurality of light emitting cells 56 separated from each other and a transparent electrode layer 61 are formed on a single substrate 51, as described above in FIG. 3, FIG. 4, and FIG. 5. Each of the light emitting cells 56 includes a lower semiconductor layer 55, an active layer 57, and an upper semiconductor layer 59. A buffer layer 53 may be formed between the substrate 51 and the lower semiconductor layer 55. The transparent electrode layer 61 may have openings 61a through which the upper semiconductor layers 59 are exposed.

Referring to FIG. 12, a first dielectric layer 83 is formed to cover the light emitting cells 56 and the transparent electrode layer 61. The first dielectric layer 83 is formed of a polymer and fills in spaces between the light emitting cells 56 while covering the overall surfaces of the light emitting cells 56.

Referring to FIG. 13, the first dielectric layer 83 is partially removed by etching to expose the transparent electrode layer 61. Then, wires 85 are formed on the first dielectric layer 83 and the light emitting cells 56. The wires 85 may be formed of any material described above in reference to FIG. 7.

Then, a second dielectric layer 87 (see FIG. 10) is formed to cover the wires 85 and the first dielectric layer 83. The second dielectric layer 87 is formed of the same polymer as that of the first dielectric layer 83 and may contain a phosphor.

When the second dielectric layer 87 is thicker than the first dielectric layer 83, optical transmittance may be deteriorated and the first or second dielectric layer 83 and 87 may be delaminated from the light emitting cells 56 by external impact. Accordingly, it is desirable that the second dielectric layer 87 be thinner than the first dielectric layer 83 (in the second exemplary embodiment, the thickness of the first dielectric layer 83 in the space between the light emitting cells 56).

In the second exemplary embodiment, the phosphor is described as being contained in the second dielectric layer 87, but may also be contained in the first dielectric layer 83. Further, a separate phosphor layer may be additionally formed on the second dielectric layer 87.

According to the exemplary embodiments of the present invention, first and is second dielectric layers are formed of the same material and the first dielectric layer is formed thicker than the second dielectric layer, thereby improving the bonding force between the first and second dielectric layers while preventing delamination of the second dielectric layer. Further, the second dielectric layer covers the wires and the light emitting cells, thereby preventing moisture from entering the light emitting diode, while protecting the wires and the light emitting cells from external impact.

Additionally, Cr layers or Ti layers exhibiting a high bonding force with respect to a dielectric layer are provided as the lower layer and the upper layer of the wires, thereby further improving the bonding force between the wires and the dielectric layers while preventing delamination of the second dielectric layer.

Furthermore, a phosphor is contained in the second dielectric layer or a phosphor layer is formed on the second dielectric layer to realize white and various other colors at a chip level, thereby enabling simplification of a packaging process.

It will be apparent to those skilled in the art that various modifications and variation can be made in the present invention without departing from the spirit or scope of the invention. Thus, it is intended that the present invention cover the modifications and variations of this invention provided they come within the scope of the appended claims and their equivalents.

What is claimed is:

1. A light emitting diode device, comprising:
a plurality of light emitting cells arranged on a substrate, each light emitting cell comprising a first semiconductor layer and a second semiconductor layer arranged on the first semiconductor layer;
a first dielectric layer arranged on each light emitting cell and comprising a first opening to expose the first semiconductor layer and a second opening to expose the second semiconductor layer;
a wire arranged on the first dielectric layer to couple two of the light emitting cells; and
a second dielectric layer arranged on the first dielectric layer and the wire,
wherein the first dielectric layer and the second dielectric layer comprise the same material and the first dielectric layer is thicker than the second dielectric layer.

2. The light emitting diode device of claim 1, wherein the first dielectric layer is about 4500 Å to 1 μm thick and the second dielectric layer is thicker than 500 Å.

3. The light emitting diode device of claim 2, wherein the first dielectric layer and the second dielectric layer each comprise silicon oxide.

4. The light emitting diode device of claim 2, wherein the wire comprises a multilayer structure comprising a first layer contacting the first dielectric layer and a second layer contacting the second dielectric layer, and the first layer and the second layer comprise Cr or Ti.

5. The light emitting diode device of claim 4, wherein the wire further comprises a third layer arranged between the first layer and the second layer.

6. The light emitting diode device of claim 5, wherein the third layer comprises Au, Ni, Al, or an alloy thereof.

7. The light emitting diode device of claim 2, wherein the first dielectric layer and the second dielectric layer comprise silicon nitride.

8. The light emitting diode device of claim 1, wherein the first dielectric layer and the second dielectric layer comprise a polymer.

9. The light emitting diode device of claim 8, wherein the second dielectric layer further comprises a phosphor.

10. The light emitting diode device of claim 1, further comprising a phosphor layer arranged on the second dielectric layer.

11. The light emitting diode device of claim 1, further comprising a transparent electrode layer arranged between the first dielectric layer and the second semiconductor layer.

12. The light emitting diode device of claim 11, wherein the transparent electrode layer comprises indium tin oxide (ITO).

13. The light emitting diode device of claim 11, wherein the transparent electrode layer comprises at least one metal selected from the group consisting of Au, Ni, Pt, Al, Cr, Ti, and alloys thereof.

14. The light emitting diode device of claim 11, wherein the transparent electrode layer comprises an opening through which the second semiconductor layer is exposed, and
wherein the wire is arranged in the opening.

* * * * *